United States Patent [19]

Kovac

[11] 4,160,262

[45] Jul. 3, 1979

[54] CCD ELECTRODE AND CHANNEL STRUCTURE FOR 180° TURN

[75] Inventor: Michael G. Kovac, Sudbury, Mass.

[73] Assignee: RCA Corporation, New York, N.Y.

[21] Appl. No.: 943,146

[22] Filed: Sep. 18, 1978

Related U.S. Application Data

[63] Continuation of Ser. No. 786,402, Apr. 11, 1977, abandoned.

[51] Int. Cl.² ............... H01L 29/78; G11C 19/28
[52] U.S. Cl. .......................... 357/24; 307/221 D; 357/20
[58] Field of Search .............. 357/24; 307/221 D

[56] References Cited

U.S. PATENT DOCUMENTS

| | | | |
|---|---|---|---|
| 3,921,194 | 11/1975 | Engeler et al. | 357/24 |
| 3,967,306 | 6/1976 | Bower | 357/24 |
| 3,971,003 | 7/1976 | Kosonocky | 357/24 |
| 4,010,485 | 3/1977 | Sauer | 357/24 |

OTHER PUBLICATIONS

Sequin, et al., *Charge Transfer Devices*, Academic Press, N.Y. (7/75), pp. 19–27, 32–39.
Lancaster, et al., "A Recirculating CCD with Novel Input and Output Structures", IEEE Int. Electron Devices Meeting (12/74) Tech. Dig. pp. 108–111.
Walsh, "A 190x244 Charge-Coupled Area Image Sensor . . . ", Symposium Charge-Coupled Device Technology for Scientific Imaging Applications, Pasadenda, Calif. (3/75), Proc. pp. 137–149.

*Primary Examiner*—William D. Larkins
*Assistant Examiner*—Gene M. Munson
*Attorney, Agent, or Firm*—H. Christoffersen; Samuel Cohen

[57] ABSTRACT

Structure which permits the 180° turns in a charge coupled device (CCD) serpentine delay line to be made with a relatively small effective radius of curvature and yet have them operate with little charge transfer loss. The small radius allows adjacent legs of the delay line to be spaced relatively close to one another so that a relatively long length of line can be fabricated on a relatively small substrate area.

8 Claims, 4 Drawing Figures

CCD ELECTRODE AND CHANNEL STRUCTURE FOR 180° TURN

This is a continuation of application Ser. No. 786,402, filed Apr. 11, 1977, now abandoned.

The present invention deals with a charge coupled device (CCD) serpentine delay line and particularly with the structure forming the 180° turns of the delay line.

Serpentine delay lines are well known in the art. Such a line can be thought of as a plurality of parallel legs adjacent pairs of which are joined to one another at respective 180° turns. The serpentine configuration permits a relatively long line to be fabricated on a relatively small semiconductor chip. In the design of a CCD serpentine delay line, it is desirable that the adjacent legs of the delay line be relatively close to one another to maximize the utilization of the substrate area. This implies that the effective radius of the 180° turns be relatively small. However, in attempting to realize such structures, the layout becomes more difficult. Also, it is found that as the radius of the turn is decreased, the high frequency charge transfer losses increase, that is, the high frequency performance of the delay line deteriorates. The CCD electrodes taper from a wider dimension at the outside edge of the CCD channel at the 180° turn to a narrower dimension at the inner edge of the channel. As the radius of curvature of the turn becomes smaller and smaller, it soon becomes impossible to satisfy the design rules which require a certain electrode length along the inner edge of the channel, while keeping the average electrode length sufficiently small to obtain high charge transfer speed, while maintaining sufficient electrode area to define a sufficiently large potential well to accept the maximum charge signal expected.

Figure 1:
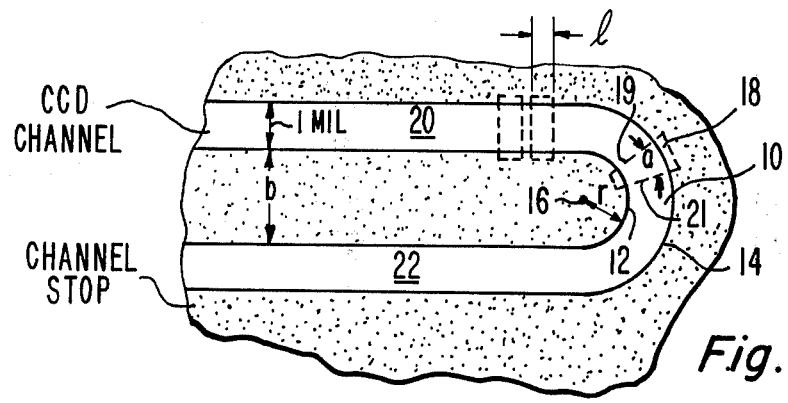
FIG. 1 is a diagrammatic showing of a portion of a CCD serpentine delay line to illustrate the problem discussed above.

FIG. 1 illustrates the straightforward approach to the fabrication of a 180° turn in a serpentine delay line. The CCD channel is shown to have a width of 1 mil. The turn comprises a channel region 10 defined by an inner arc 12 of a first circle and an outer arc 14 of a second circle. These circles may be drawn from a common center 16 so that the channel width throughout the turn is 1 mil. With an arrangement of this type, the electrodes are of the shape shown in phantom at 18, with the edges 19 and 21 of the electrodes lying on substantially radial lines extending from center 16, and with the electrodes extending over the channel stop regions.

As should be clear from FIG. 1, it is desirable that the radii of the arcs 12 and 14 be as small as possible so that legs 20 and 22 be as close to one another as possible, so as to maximize the "packing density." Photolithographic techniques limit the minimum length (dimension a) that the electrode can be at the inner arc. In one particular application, the design rules required that the minimum length of the electrode at this arc be equal to the length l of the electrodes in the straight channels such as 20 (two such electrodes are shown in phantom in FIG. 1). As the radius decreases, it is necessary to increase the length dimension a of the electrodes along the outer arc 14 to maintain sufficient potential well capacity to receive the maximum charge signal expected. However, this increases the average length a of the electrodes in the 180° turn region of the CCD and this increase in length causes a substantial increase in high frequency losses in the turn compared to the losses in the straight channels and thereby degrades the overall high frequency performance of the CCD.

While it is difficult to calculate for a particular set of parameters what the smallest radius r can be while still maintaining high charge transfer efficiency, in one particular design in which the channels were 1 mil wide, it was found that the adjacent channels 20 and 22 could be spaced no closer than about 1.5 to 2 mils (dimension b). This space between the two channels comprises wasted space. If the packing density is to be increased, the dimension b must be reduced substantially.

Figure 2:
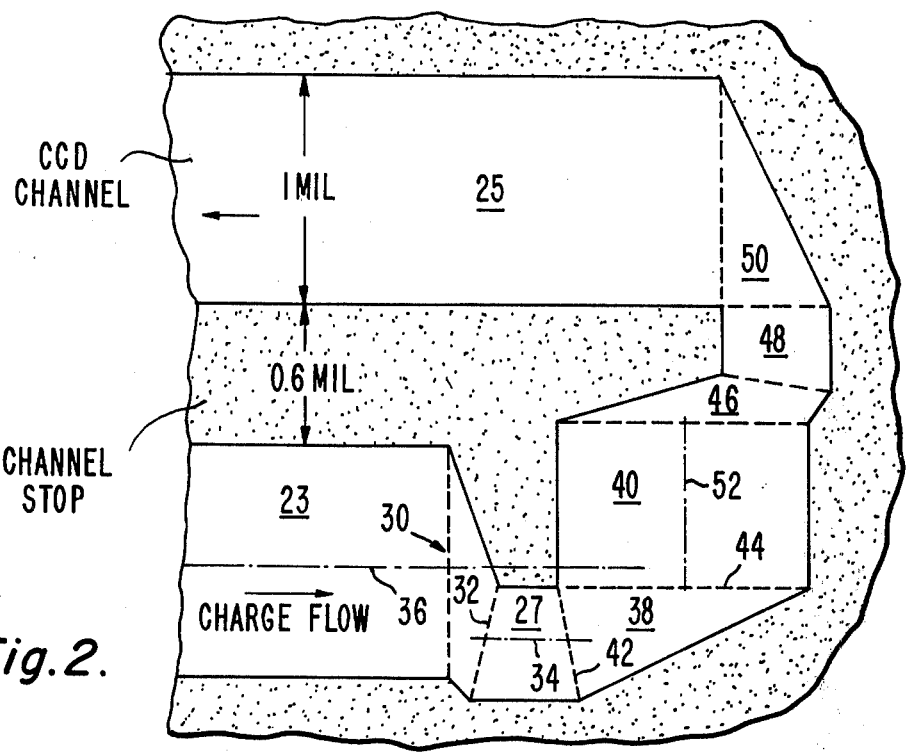
FIG. 2 is a plan view showing the channel shape at a 180° turn of a CCD serpentine delay line embodying the invention.
Figure 4:
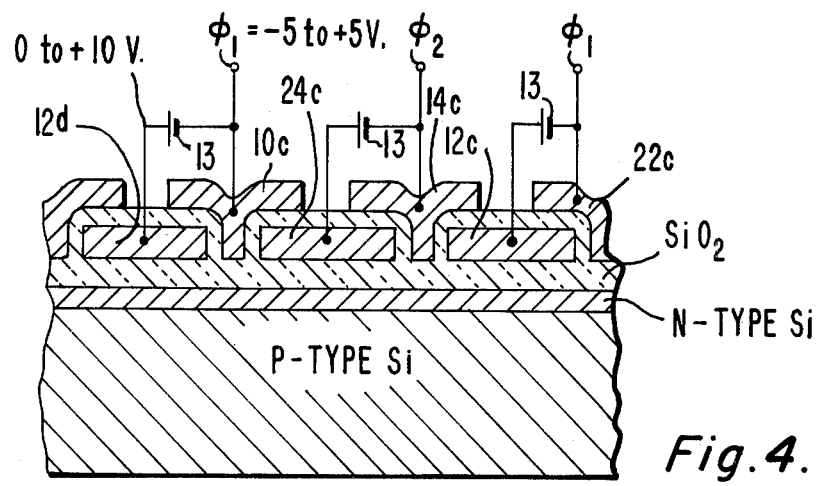
FIG. 4 is a cross-section along line 4—4 of FIG. 3.
Figure 3:
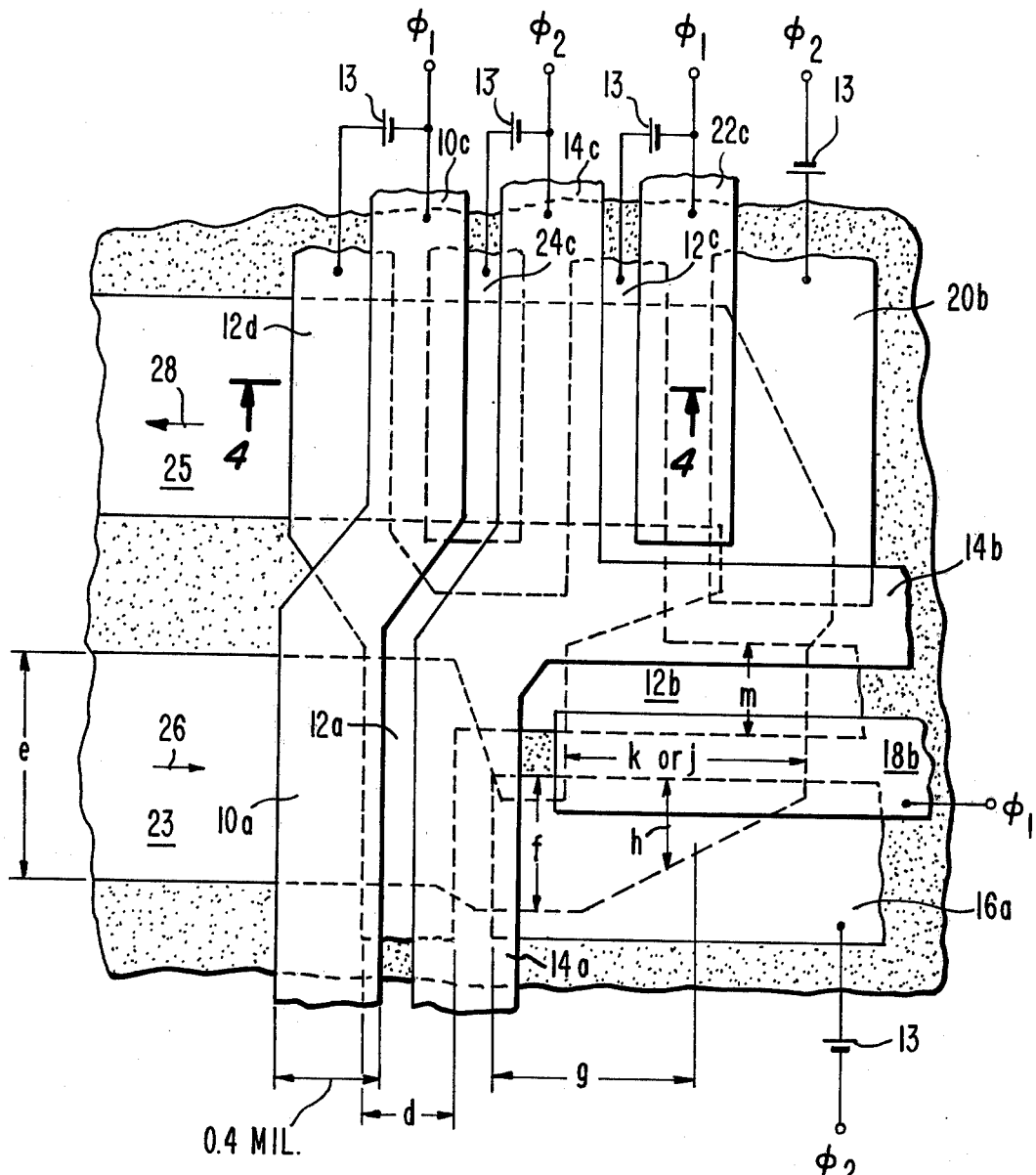
FIG. 3 is a plan view of the channel and the overlying electrodes of the same embodiment of the invention as illustrated in FIG. 2.

An improved 180° turn embodying the invention is illustrated in FIGS. 2 and 3. FIG. 2 is included to show the shape of the channel. FIG. 3 shows also the CCD electrodes. FIG. 4 is a section through certain of the electrodes. The device illustrating by way of example is a two-phase CCD fabricated by employing two "levels" of electrodes, both the same distance from the substrate. The asymmetrical potential wells beneath the electrode pairs are obtained by virtue of a voltage offset between the two electrodes of each pair. This offset is indicated schematically in FIG. 4 by the 5 volt batteries 13. Each asymmetrical well is relatively deep beneath the first level or storage electrode (such as 12d) of each pair and relatively shallow beneath the second level or transfer electrode (such as 10c) of each pair. The electrodes employed may be all polysilicon electrodes or those in the first level may be formed of polysilicon and those in the second level formed of a metal such as aluminum.

Referring now to FIGS. 3 and 4, the electrodes of the lower channel 23 include electrode pair 10a, 12a, electrode 12a being in the first level and electrode 10a in the second. This pair of electrodes is driven by the phase 1 ($\phi_1$) voltage. The next pair of electrodes comprises 14a, 16a, the former being in the second level and the latter in the first, and both electrodes being driven by the phase 2 ($\phi_2$) voltage. The following pair comprises phase 1 electrodes 18b, 12b, electrode 12b comprising an extension of electrode 14a. The next electrode pair, a $\phi_2$ pair, comprises electrodes 14b and 20b, electrode 14b comprising an extension of electrode 14a. The next electrode pair, a $\phi_1$ pair, comprises electrodes 22c and 12c, electrode 12c comprising an extension of electrode 12a. The following electrode pair, a $\phi_2$ pair, comprises electrodes 14c and 24c, electrode 14c comprising an extension of electrode 14a. The last electrode pair illustrated comprises electrodes 10c and 12d, electrode 10c being an extension of 10a and 12d an extension of 12a.

The direction of charge propagation is an indicated by arrows 26 and 28. The electrodes are arranged so that of each electrode pair, the electrode which is at the more positive potential is at the leading edge of the charge signal being propagated and the electrode at the more negative potential is at the lagging edge of the charge signal being propagated.

In the particular embodiment chosen by way of illustration, the CCD is of the "buried channel" type as is clear from FIG. 4. That is, the bulk of the substrate is P-type silicon and there is a thin layer of N-type silicon over the P-type silicon, with a PN junction at the interface between the N layer and the underlying substrate. The channels are defined by channels stops, illustrated by stippling. These may comprise P+ diffusions.

The 180° turn embodying the present invention makes use of the principle that charge can be propagated at high speed out of a potential well if that well is relatively short in the charge propagation direction. (The dimension of a potential well in this direction hereafter is termed the "length" of the well.) More precisely, the charge transfer speed is inversely proportional to at least the square of the length of the well ($T=1/l^n$, where T is the transfer time, l the electrode length and $n \geq 2$). The operation also makes use of the finding that the transmitting potential well can have a relatively large width dimension without seriously affecting the charge transfer speed. (The dimension of the potential well in the channel width direction is hereafter termed the "width" of the well.) Further, the structure operates on the principle that the receiving potential well can be relatively long in its length dimension without materially reducing the charge transfer speed and can be relatively short in its width dimension. Finally, use is made of the principle that it is possible to taper the channel width, to a certain extent, in the direction of charge transfer, without substantially adversely affecting the charge transfer speed.

In the discussion which follows, it will be shown how the principles above apply to the 180° turn illustrated. Assume first that the charge initially is present beneath the elecrode pair 10a, 12a and is to be transferred to beneath the following electrode pair 14a, 16a. The charge initially is in the storage well beneath electrode 12a. The length d of the potential well in one particular design, is 0.4 mils which is the length of the overlying electrode 12a. The width e of the potential well is equal to 1 mil which is the width of the channel. It is found, in practice, that transfer from a 0.4 mil width well can be accomplished at very high speed.

The receiving well width dimension f is substantially smaller than e. It is roughly 0.5 mil. However, it is found, in practice, that this relatively smaller width f does to adversely affect the charge transfer speed. The effective average length g of the receiving potential well beneath electrode 16a, is much greater than d, the length of the transmitting potential well. In practice, this average length may be of the order of 0.8 mils. (The design rule which must be kept in mind is that the capacity of the storage well beneath electrode 16a must be at least equal to that of the storage well beneath electrode 12a so that when a charge transfer occurs, none of the charge will remain under electrode 12a or overflow elsewhere, even for a full well beneath electrode 12a.) Even though the receiving potential well beneath electrode 16a is relatively long, this does not adversely affect the charge transfer speed. This has been found empirically and there is also a theoretical explanation of why this occurs which is not discussed herein.

The transfer above from the potential well beneath a phase 1 electrode to a potential well beneath a phase 2 electrode, can be accomplished in any one of a number of ways. Operation can be by means of "drop-clock" or "push-clock" voltages or by the use of symmetrical clocks. For purpose of the present discussion, the case of symmetrical $\phi_1$ and $\phi_2$ voltages will be assumed. The N layer is assumed initially to be depleted. Initially, $\phi_1$ may be at a level of +5 volts so that electrode 10a is at +5 volts and electrode 12a at +10 volts. This may create a 4 volt offset between the substrate voltage of the transfer well beneath electrode 10a and that of the storage well beneath electrode 12a. At the same time, $\phi_2$ may be at −5 volts so that electrode 14a is at −5 volts and electrode 16a at 0 volts. To effect a transfer, $\phi_2$ is changed from −5 volts to −5 volts and concurrently, $\phi_1$ is changed from +5 volts to −5 volts. This concurrently increases the depth of the transfer well beneath electrode 14a and the depth of the storage well beneath electrode 16a, while decreasing the depth of the corresponding wells beneath electrodes 10a and 12a, respectively, causing the charge carriers to transfer from the well beneath 12a to the well beneath 16a.

Upon the completion of the transfer, the charge carriers will be stored in the storage potential well beneath that portion of electrode 16a lying over the CCD channel. These carriers will next be transferred from this potential well to the well beneath electrode 12b. This transfer is accomplished by concurrently decreasing the $\phi_2$ potential and increasing the $\phi_1$ potential. During this transfer, the same desired conditions are present as are discussed above. The average length dimension of the transmitting potential well comprises dimension h. In the design illustrated, this is roughly 0.4 mils or so (actually is somewhat less than 0.4 mils). With a length dimension this small, charge transfer takes place at high speed. The width dimension j is made somewhat over 1 mil but this does not adversely affect the charge transfer speed as already indicated. The increased width is for the purpose of insuring that the storage well is of sufficient charge storage capacity.

The receiving well comprises the substrate region in the channel beneath electrode 12b. Its width dimension k is equal to dimension j. Its length dimension m averaged out is roughly 0.4 mils.

With the explanation above in mind, one can trace out the remainder of the charge propagation around the 180° turn. In each case the principles already discussed are followed. That is, in each case the transmitting potential well has a relatively short length and it can have a relatively larger width. With respect to the receiving potential well, the length is found not to be critical and can be substantially greater than the length of the transmitting potential well. The width of the receiving potential well can be substantially smaller than the width of the transmitting potential well. Each receiving well later acts as a transmitting well but the well is so oriented, relative to the channel, that when it acts as a transmitter, its length is short (even though its length as a receiver may be long). See, for example, electrode 16a which receives charge via a short edge of the electrode into a long potential well (dimension g) but which transmits charge via a long edge of the electrode from a potential well having a short length (dimension h).

Each 180° turn comprises two 90° turns. Each 90° turn comprises an input region in which the channel tapers from a large width at 30 (of the order of 1 mil) to a smaller width at 32 (of the order of ½ mil). This input section is followed by an output section which broadens from a relatively smaller width to a relatively larger width (somewhat larger than 1 mil).

The tapered section 30 to 32 (FIG. 2) extends from the main channel 32 to a narrower channel 27. In order to keep the 180° turn "tight," that is, to maintain the effective radius of curvature of the 180° turn small, the center line 34 of the channel section 27, is below the center line 36 of the channel section 23. In other words, the channel 27 is displaced relative to the channel section 23 in the direction away from the 180° turn direction. Indeed, in the particular design illustrated the entire channel section 27 is below the center line 36 of the main channel section 23 (although in other designs the displacement can be less and the center line 36 can pass through 27). Displacing the narrow channel section 27 leaves more room for the following broadening transition region 38 which connects the narrow channel section 27 with the following relatively wide channel section 40. The transition region 38 extends between dashed lines 42 and 44. The broad channel section 40 has a length dimension at right angles to the main channel 23 and thus the various regions just described comprise a 90° turn. The shape of the channel is also such as to allow the electrodes to overlap the channel stops at the corners of the 180° turn, and still maintain the design rules for separation between adjacent electrodes which still require relatively few electrodes in the 180° turns.

As mentioned briefly already, the channel section 40 can be made somewhat wider than the channel section 23 to increase the size of the potential wells in the region 40 to make them at least equal to the potential wells in the main channels 23 and 25.

Following the 90° turn just described, there is another 90° turn to complete the 180° turn. This following 90° turn is similar to the one described. It includes a tapered region 46 between the wide channel 40 and the narrower channel 48. The latter is followed by a broading transition region 50 which joins the narrow channel 48 to the main channel 25. The narrow channel 48 is offset with respect to the center line 52 of channel section 40 similarly to the offset of the channel section 27 with respect to channel 23.

Following the design principles outlined, it has been found possible to construct a serpentine delay line with 1 mil wide channels which are spaced from one another by 0.6 mil wide channel stops. The electrodes employed were 0.4 mils in length in the channels 23, 25 and so on and averaged about 0.4 mils in length in the 180° turns. In certain potential commercial applications, the serpentine delay line has been operated at 10.7 MHz with substantially no signal deterioration when going around the 180° turn. The same delay line has been operated at 20 MHz with substantially no signal deterioration and it is expected that even higher frequency operation can be achieved.

While the invention has been illustrated in terms of a buried channel CCD, it is to be understood that the design principles are also applicable to surface channel CCD's. Further, the substrate doping employed is intended merely to be illustrative as clearly the same principles apply using N-type substrates with P-type surface layer and are applicable also to either P or N substrate surface channel devices. It is also to be understood that while two layer electrodes structures operated in two-phase fashion are illustrated, other configurations within the scope of the present invention are possible. For example, the invention, of course, is applicable to three or higher phase structures. It is also applicable to single-layer electrode structures. It is also applicable to two-phase configurations in which one electrode of each pair is closer to the substrate than the other electrode of the pair and to two phase configurations employing ion implants to create the asymmetrical potential wells.

The discussion herein of the operation of buried channel CCD's is brief. More details are available in the literature as, for example, in the article Basic Concepts of "Charge Coupled Devices" by W. F. Kosonocky and J. E. Carnes, RCA Review, Vol. 36, No. 3, pp. 566, September 1975.

What is claimed is:

1. In a charge-coupled device (CCD) which includes a semiconductor substrate, a channel in the substrate for the propagation of charge in said substrate, said channel making a turn of approximately 180°, the edges of said channel being defined by potential barriers in the substrate for confining any charge which may be present in the channel to the channel, the channel comprising an input first channel region having an output end, a second channel region, receptive of charge from the output end of said first channel region, said second channel region having an input end and an output end, and a third channel region receptive of charge from the second channel region, said third channel region having an input end, said first, second and third channel regions each having a length dimension in the direction of charge propagation along that channel region, and a width dimension at right angles to its length dimension and which extends between the edges defined by said potential barriers of said channel region, the length dimension of the second channel region being at an angle of approximately 90° to the length dimension of the first channel region, and the length dimension of the third channel region being at approximately 90° to the length dimension of the second channel region, said CCD including also electrode means insulated from the substrate over said channel and receptive of potentials for forming potential wells in the channel for the storage of charge and for the propagation of charge from the first to the second to the third channel regions, each electrode means having a length dimension in the direction of charge transfer along the channel region it is over and an effective width dimension at right angles to the length dimension equal to the width of the channel region the electrode is over, the improvement in said structure comprising:

a first one of said electrode means over the first channel region;

a second one of said electrode means over the output end of the first channel region and the input end of the second channel region;

a third one of said electrode means over the output end of the second channel region and the input end of the third channel region;

said first electrode means having a given effective length over said first channel region in the direction of the length dimension of said first channel region which is sufficiently small that during the transfer of charge from a substrate region beneath said first electrode means, charge propagation at a desired propagation speed will take place;

said second electrode means having an effective first length in the direction of the length dimension of said first channel region which is substantially greater than said given length and an effective second length in a second direction at approximately 90° to said length dimension of said first channel region, that is, in the direction of the length dimension of said second channel region, which is not substantially greater than said given effective length;

said third electrode means having an effective first length in the direction of the length dimension of said second channel region which is substantially greater than said given length and an effective second length in the direction of the length dimension of said third channel region which is not substantially greater than said given effective length;

first means including said first and said second electrode means responsive to applied potentials for propagating charge in the direction of the length dimension of said first channel region from a substrate region beneath said first electrode means to a substrate region beneath said second electrode means;

second means including said second and said third electrode means responsive to applied potentials for propagating charge in the direction of the length dimension of said second channel region from said substrate region beneath said second electrode means to a substrate region beneath said third electrode means; and third means including said electrode means, responsive to applied potentials, for propagating charge in the direction of the length dimensioned of said third channel region from said substrate region beneath said third electrode means into said third channel region.

2. In a CCD as set forth in claim 1, said first channel region including a tapered region, the edges of which are defined by potential barriers in the substrate, said tapered region having an input end and said tapered region terminating at the output end of said first channel region, said output end being of substantially smaller width than the input end of the tapered region.

3. In a CCD as set forth in claim 2, the output end of the tapered region being offset in a direction away from said third channel region relative to the input end of the tapered region.

4. In a CCD as set forth in claim 2, the portion of said channel beneath said second electrode means comprising a fourth channel region with parallel edges defined by potential barriers in the substrate, the fourth channel region being of the same width as the output end of said tapered region, and a fifth channel region, the input end of which comprises the output end of the fourth channel region, and which widens from this input end to an output end which is at an angle of approximately 90° to said input end of said fifth channel region, said output end comprising the input end of the second channel region and having a width comparable to that of said first channel region, the edges other than the input and output ends of the fifth channel region being defined by potential barriers in the substrate.

5. In a CCD as set forth in claim 4, said second channel region including a second tapered region, the tapered edges of which are defined by potential barriers in the substrate, said second tapered region having an input end, and terminating at the output end of the second channel region at an output end, said output end of said second tapered region being of substantially smaller width than the input end of said second tapered region, and the portion of said channel beneath said third electrode comprising a sixth channel region with parallel edges defined by potential barriers in the substrate and extending in the direction of the length dimension of the second channel, the sixth channel region being of the same width as the output end of the second tapered region, and a seventh channel region, the input end of which comprises the output end of the sixth channel region and which widens from this input end to an output end which is at an angle of approximately 90° to said input end of said seventh channel region, said output end comprising the input end of the third channel region and having a width comparable to that of said first channel region, the edges other than the input and output ends of said seventh channel region being defined by potential barriers in the substrate.

6. In a CCD as set forth in claim 5, said sixth channel region being offset relative to the input end of said tapered second region in the direction of the length dimension of said first channel region and away from the output end of said first channel region.

7. In a CCD as set forth in claim 5, said third channel region being spaced from said first channel region a distance less than the width of the first channel region.

8. In a CCD as set forth in claim 7, said third channel region being spaced from said first channel region a distance less than 1 mil.

* * * * *